(12) United States Patent
Kondo et al.

(10) Patent No.: US 10,879,847 B2
(45) Date of Patent: Dec. 29, 2020

(54) TRANSMISSION UNIT

(71) Applicant: Murata Manufacturing Co., Ltd., Kyoto (JP)

(72) Inventors: Masao Kondo, Kyoto (JP); Satoshi Tanaka, Kyoto (JP); Yasuhisa Yamamoto, Kyoto (JP); Takayuki Tsutsui, Kyoto (JP); Isao Obu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 34 days.

(21) Appl. No.: 16/223,300

(22) Filed: Dec. 18, 2018

(65) Prior Publication Data

US 2019/0190455 A1    Jun. 20, 2019

(30) Foreign Application Priority Data

Dec. 20, 2017 (JP) ................................ 2017-244142

(51) Int. Cl.
| | |
|---|---|
| *H03F 1/02* | (2006.01) |
| *H03F 3/19* | (2006.01) |
| *H03G 3/30* | (2006.01) |
| *H03F 3/24* | (2006.01) |
| *H03G 3/00* | (2006.01) |

(52) U.S. Cl.
CPC ......... *H03F 1/0211* (2013.01); *H03F 1/0261* (2013.01); *H03F 3/19* (2013.01); *H03F 3/245* (2013.01); *H03G 3/007* (2013.01); *H03G 3/3042* (2013.01); *H03F 2200/102* (2013.01); *H03F 2200/211* (2013.01); *H03F 2200/222* (2013.01); *H03F 2200/387* (2013.01); *H03F 2200/451* (2013.01); *H03F 2203/21103* (2013.01); *H03F 2203/21139* (2013.01); *H03G 2201/106* (2013.01)

(58) Field of Classification Search
CPC ........ H03F 1/0211; H03F 1/0261; H03F 3/19; H03F 3/245; H03F 2200/211; H03F 2200/451; H03F 2200/102; H03F 2200/387; H03F 2203/21103; H03F 2203/21139; H03F 2200/222; H03G 3/007; H03G 3/3042; H03G 2201/106
USPC ....................................... 330/284, 296, 285
See application file for complete search history.

(56) References Cited

U.S. PATENT DOCUMENTS 3,428,910 A * 2/1969 Black .................. H03G 3/3057
330/279
2002/0196084 A1    12/2002 Jeong

FOREIGN PATENT DOCUMENTS

WO    2013/133170 A1    9/2013

OTHER PUBLICATIONS

Staudinger et al. "High Efficiency CDMA RF Power Amplifier Using Dynamic Envelope Tracking Technique," IEEE MTT-S Digest, Jun. 2000, pp. 873-876, vol. 2, IEEE.

* cited by examiner

*Primary Examiner* — Khanh V Nguyen
*Assistant Examiner* — Khiem D Nguyen
(74) *Attorney, Agent, or Firm* — Pearne & Gordon LLP

(57) ABSTRACT

A transmission unit includes a first transistor that amplifies power of a first signal and outputs a second signal, a power supply circuit that supplies to the first transistor a power supply voltage that changes in accordance with an amplitude level of the first signal, and an attenuator that attenuates the first signal in such a manner that an amount of attenuation of the first signal increases with a decrease in the power supply voltage when the power supply voltage is less than a first level.

17 Claims, 11 Drawing Sheets

TRANSMISSION UNIT

This application claims priority from Japanese Patent Application No. 2017-244142 filed on Dec. 20, 2017. The content of this application is incorporated herein by reference in its entirety.

BACKGROUND OF THE DISCLOSURE

1. Field of the Disclosure

The present disclosure relates to a transmission unit.

2. Description of the Related Art

A mobile communication device such as a cellular phone includes a power amplifier module to amplify the power of a radio frequency (RF) signal to be transmitted to a base station. Recent cellular phones adopt communication standards for high-speed data communication, such as Long Term Evolution (LTE) or LTE-Advanced. In such communication standards, a peak-to-average power ratio (PAPR), which is the ratio of peak power to average power of an RF signal, is generally increased to raise the communication speed. To maintain high linearity even in a high-PAPR situation, a high power supply voltage is required, and the power consumption of a power amplifier module tends to increase.

On the other hand, cellular phones are demanded to have power consumption reduced to increase the time available for conversation or communication. To address this issue, for example, transmission devices that adopt an envelope tracking (ET) mode in which a power supply voltage is controlled in accordance with the amplitude level of a modulated signal are disclosed in International Publication 2013/133170 and by Staudinger et al. in "High Efficiency CDMA RF Power Amplifier Using Dynamic Envelope Tracking Technique," IEEE MTT-S Digest, 2000, vol. 2, pp. 873-876. In the ET mode, specifically, a power supply voltage that tracks changes in the amplitude level of a modulated signal is generated to improve power efficiency.

Transmission devices based on the ET mode typically have gains that increase with increasing power supply voltages. Thus, changing a power supply voltage allows an amplifier to operate under high power efficiency conditions with the gain maintained substantially constant. However, a power supply voltage has a lower limit required for a power supply device to operate correctly. Thus, in a low output power region, a power supply voltage may fail to have a value that would be taken otherwise, making the gain in the low output power region higher than that in any other region and causing deterioration of linearity.

BRIEF SUMMARY OF THE DISCLOSURE

Accordingly, it is an object of the present disclosure to provide a transmission unit with high power efficiency and enhanced linearity in gain.

According to preferred embodiments of the present disclosure, a transmission unit includes a first transistor that amplifies power of a first signal and outputs a second signal, a power supply circuit that supplies a power supply voltage to the first transistor, the power supply voltage changing in accordance with an amplitude level of the first signal, and an attenuator that attenuates the first signal in such a manner that an amount of attenuation of the first signal increases with a decrease in the power supply voltage when the power supply voltage is less than a first level.

According to preferred embodiments of the present disclosure, it is possible to provide a transmission unit with high power efficiency and enhanced linearity in gain.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

The following describes embodiments of the present disclosure in detail with reference to the drawings. The same or substantially the same elements are denoted by the same numerals or symbols and will not be described repeatedly.

Figure 1:
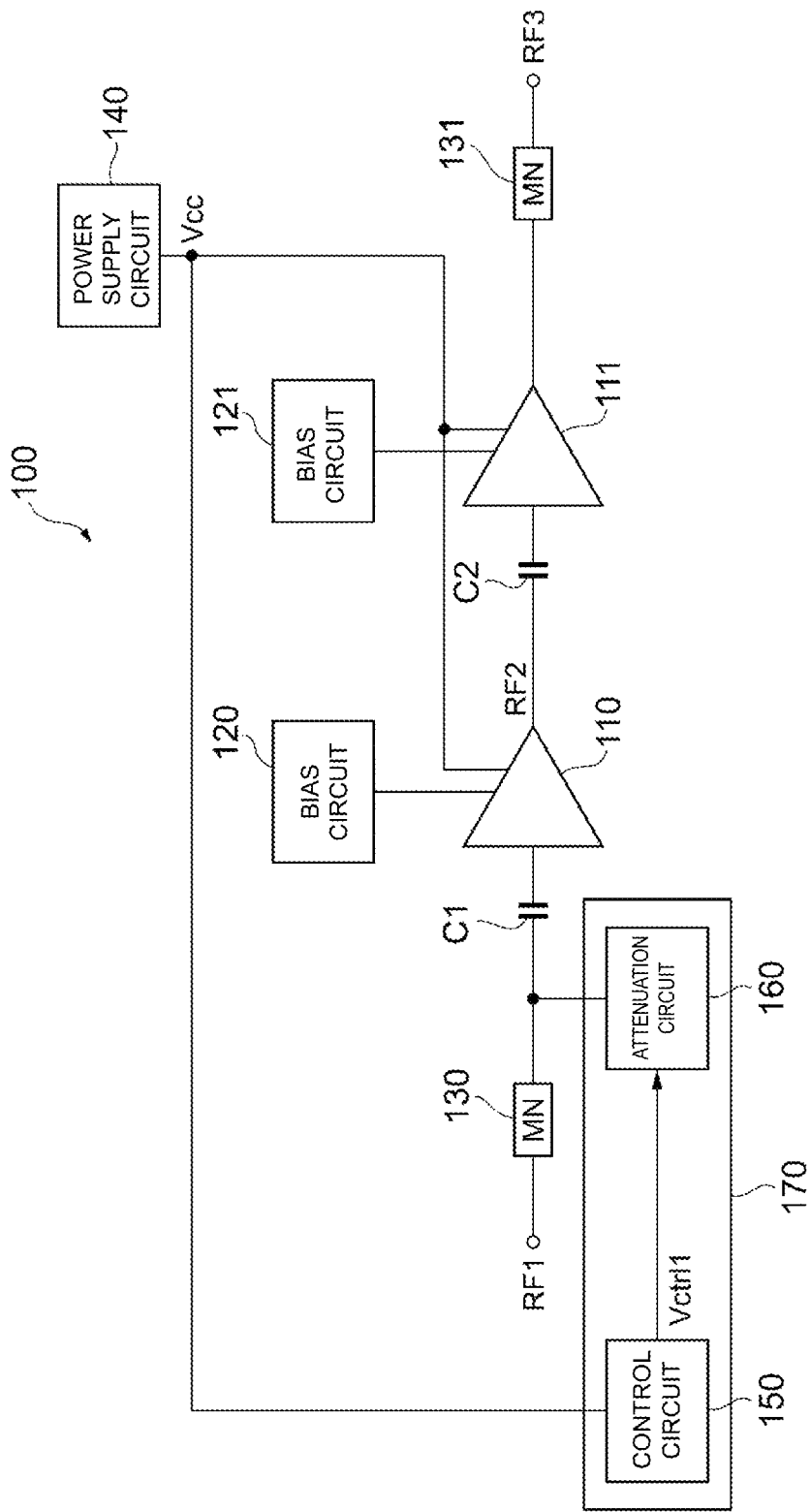
FIG. 1 illustrates an overview of a configuration of a transmission unit according to a first embodiment of the present disclosure.

FIG. 1 illustrates an overview of a configuration of a transmission unit according to a first embodiment of the present disclosure. A transmission unit 100 illustrated in FIG. 1 is mounted in, for example, a mobile communication device such as a cellular phone and is used to amplify the power of a radio frequency (RF) signal to a level required to transmit the RF signal to a base station. The transmission unit 100 amplifies a transmit signal conforming to a communication standard such as, for example, the second-generation mobile communication system (2G), the third-generation mobile communication system (3G), the fourth-generation mobile communication system (4G), the fifth-generation mobile communication system (5G), Long Term Evolution Frequency Division Duplex (LTE-FDD), LTE Time Division Duplex (LTE-TDD), LTE-Advanced, or LTE-Advanced Pro. An RF signal has a frequency of about several hundreds of megahertz (MHz) to several tens of gigahertz (GHz), for example. The communication standards and frequencies of signals to be amplified by the transmission unit 100 are not limited to those described above.

Specifically, the transmission unit 100 includes, for example, amplifiers 110 and 111, bias circuits 120 and 121, matching networks (MNs) 130 and 131, a power supply circuit 140, a control circuit 150, an attenuation circuit 160, and capacitors C1 and C2.

Each of the amplifiers 110 and 111 amplifies an input RF signal and outputs the amplified RF signal. That is, the transmission unit 100 performs power amplification in two stages. Specifically, the amplifier 110 in the initial stage (driver stage) amplifies an RF signal RF1 (first signal) inputted from an input terminal through the matching network 130 and outputs an RF signal RF2 (second signal). The amplifier 111 in the subsequent stage (power stage) amplifies the RF signal RF2 (second signal) supplied from the amplifier 110 and outputs an RF signal RF3 (third signal). The amplifiers 110 and 111 are each constituted by, for example, a bipolar transistor such as a compound semiconductor heterojunction bipolar transistor (HBT) composed of GaAs or the like. Each of the amplifiers 110 and 111 may be constituted by a field-effect transistor (metal-oxide-semiconductor field-effect transistor (MOSFET)) instead of by an HBT. In this case, the collector, base, and emitter may be respectively read as the drain, gate, and source. In the following description, each transistor is constituted by an HBT as an example, unless otherwise specified.

The bias circuits 120 and 121 supply bias currents or voltages to the amplifiers 110 and 111, respectively. The bias circuits 120 and 121 may adjust the bias currents or voltages to control the gains of the amplifiers 110 and 111, respectively.

The matching network 130 matches the impedances of the preceding circuit (not illustrated) and the amplifier 110. The matching network 131 matches the impedances of the amplifier 111 and the subsequent circuit (not illustrated). The transmission unit 100 may include an inter-stage matching network between the amplifier 110 and the amplifier 111 although not illustrated in FIG. 1.

The power supply circuit 140 generates a power supply voltage Vcc in accordance with an envelope tracking (ET) mode in which a power supply voltage is controlled in accordance with the amplitude level of an RF signal. Specifically, a signal indicating the envelope of the RF signal is supplied to the power supply circuit 140 from an RF unit (not illustrated), and the power supply circuit 140 generates the power supply voltage Vcc, which tracks changes in the amplitude level of the RF signal, in accordance with the envelope signal and supplies the power supply voltage Vcc to the amplifiers 110 and 111. Further, the power supply circuit 140 supplies the power supply voltage Vcc to the control circuit 150. The transmission unit 100, which is based on the ET mode, improves power efficiency compared to when, for example, the transmission unit 100 is based on an average power tracking (APT) mode.

The control circuit 150 and the attenuation circuit 160 constitute an attenuator 170. When the power supply voltage Vcc is comparatively low, the attenuator 170 attenuates the RF signal RF1, thereby reducing the gain of the transmission unit 100 when the transmission unit 100 has a comparatively small output power.

Specifically, the control circuit 150 generates a control voltage Vctrl1 based on the power supply voltage Vcc supplied from the power supply circuit 140 and supplies the control voltage Vctrl1 to the attenuation circuit 160. The control voltage Vctrl1 is a voltage for controlling the amount of attenuation at the attenuation circuit 160. The attenuation circuit 160 attenuates the RF signal RF1 in accordance with the control voltage Vctrl1 supplied from the control circuit 150. The method for controlling the attenuation of an RF signal will be described below.

The capacitors C1 and C2 are disposed at the input of the amplifiers 110 and 111, respectively. The capacitors C1 and C2 are coupling capacitors each configured to block the direct-current (DC) component included in the RF signal and to pass the alternating-current (AC) component included in the RF signal.

A specific configuration of the transmission unit 100 will now be described with reference to FIGS. 2, 3A, and 3B.

Figure 2:
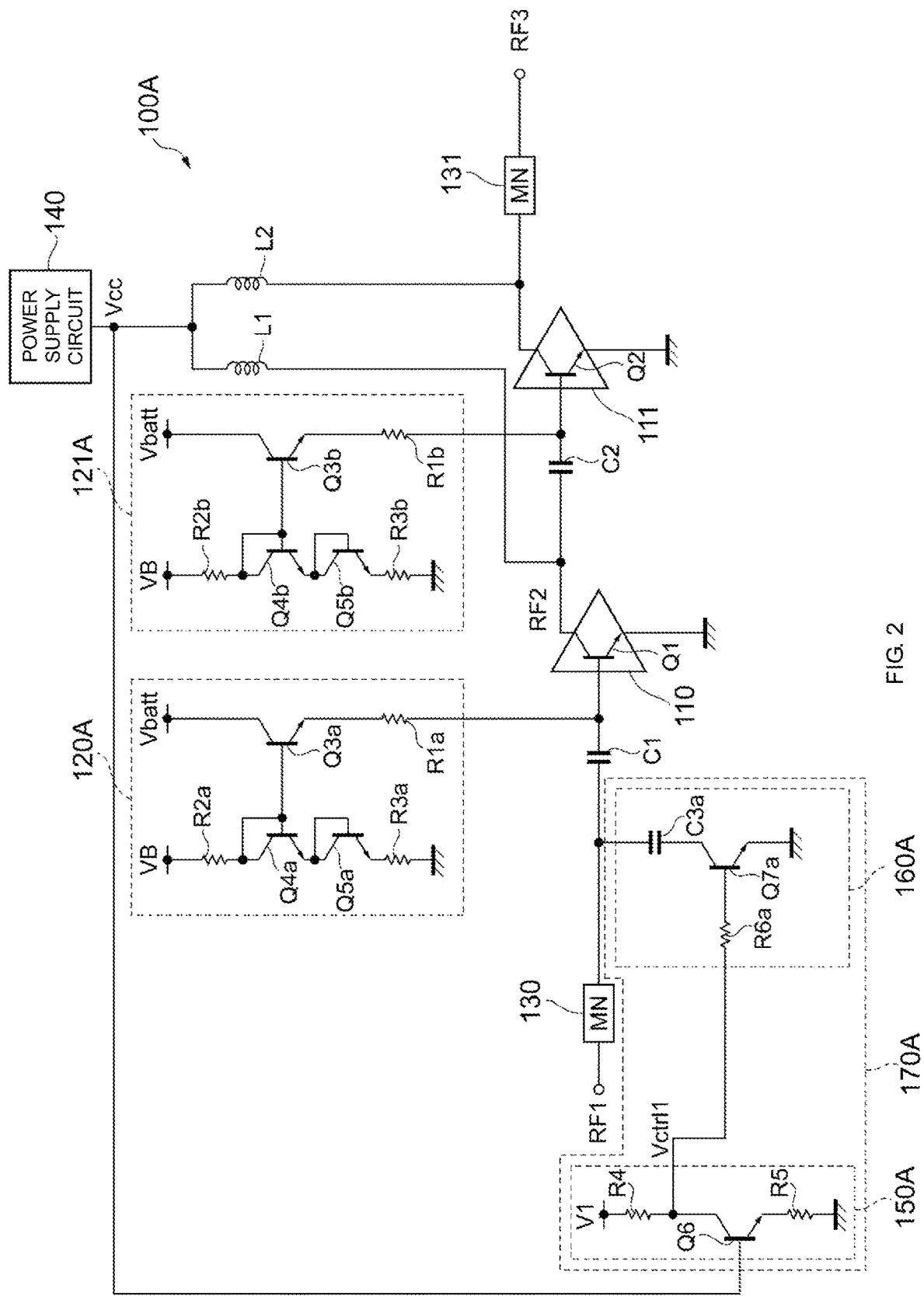
FIG. 2 illustrates an example configuration of the transmission unit according to the first embodiment of the present disclosure.

FIG. 2 illustrates an example configuration of the transmission unit according to the first embodiment of the present disclosure. In a transmission unit 100A illustrated in FIG. 2, a specific configuration of components included in the transmission unit 100 illustrated in FIG. 1, namely, the amplifiers 110 and 111, the bias circuits 120 and 121, and the attenuator 170 (the control circuit 150 and the attenuation circuit 160), is illustrated.

The amplifiers 110 and 111 include transistors Q1 and Q2, respectively. The transistor Q1 (first transistor) has a collector supplied with the power supply voltage Vcc via an inductor L1, a base supplied with the RF signal RF1 and a bias current or voltage, and an emitter connected to ground. Thus, the transistor Q1 outputs the RF signal RF2, which is obtained by amplifying the RF signal RF1, from the collector thereof. The transistor Q2 (sixth transistor) has a collector supplied with the power supply voltage Vcc via an inductor L2, a base supplied with the RF signal RF2 and a bias current or voltage, and an emitter connected to ground. Thus, the transistor Q2 outputs the RF signal RF3, which is obtained by amplifying the RF signal RF2, from the collector thereof.

The power supply voltage Vcc is supplied to one end of each of the inductors L1 and L2, and the other ends of the inductors L1 and L2 are connected to the collectors of the transistors Q1 and Q2, respectively. The inductors L1 and L2 are each a choke inductor for preventing the AC component from leaking to the power supply voltage Vcc side.

A bias circuit 120A includes, for example, transistors Q3$a$ to Q5$a$ and resistance elements R1$a$ to R3$a$. A bias circuit 121A includes, for example, transistors Q3$b$ to Q5$b$ and resistance elements R1$b$ to R3$b$. The configuration of the subsequent bias circuit 121A is similar to the configuration of the preceding bias circuit 120A and will not be described in detail, with the corresponding elements assigned similar numerals or symbols.

The transistor Q3$a$ has a collector supplied with a battery voltage Vbatt, a base connected to the base of the transistor Q4$a$, and an emitter connected to the base of the transistor Q1 via the resistance element R1$a$.

The transistor Q4a has a collector and a base interconnected (hereinafter also referred to as "diode-connected"). The collector of the transistor Q4a is supplied with a bias control voltage VB via the resistance element R2a, and the emitter of the transistor Q4a is connected to the collector of the transistor Q5a. The transistor Q5a is diode-connected, with the collector connected to the emitter of the transistor Q4a and the emitter connected to ground via the resistance element R3a. Thus, a voltage having a predetermined level (e.g., about 2.6 V) is generated at the collector of the transistor Q4a. The transistors Q4a and Q5a may be each constituted by a diode instead of a transistor. In this case, the collector (or base) and the emitter may be read as the anode and the cathode, respectively. This also applies to diode-connected transistors described below.

The resistance element R1a has an end connected to the emitter of the transistor Q3a and another end connected to the base of the transistor Q1. The resistance element R1a prevents a bias current from increasing with an increase in the temperature of a transistor. The resistance element R2a has an end supplied with the bias control voltage VB and another end connected to the collector of the transistor Q4a. The resistance element R3a has an end connected to the emitter of the transistor Q5a and another end connected to ground.

With the configuration described above, the transistor Q3a supplies a bias current to the base of the transistor Q1 from the emitter of the transistor Q3a. The amount of the bias current may be controlled in accordance with the bias control voltage VB or bias control current supplied to the collector of the transistor Q4a. The bias circuit 120A may not necessarily include the resistance elements R1a to R3a.

An attenuator 170A includes a control circuit 150A and an attenuation circuit 160A.

The control circuit 150A (first control circuit) includes a transistor Q6 and resistance elements R4 and R5.

The transistor Q6 (third transistor) has a collector supplied with a predetermined voltage V1 via the resistance element R4 (first load), a base supplied with the power supply voltage Vcc from the power supply circuit 140, and an emitter connected to ground via the resistance element R5. The resistance element R4 has an end supplied with the predetermined voltage V1 and another end connected to the collector of the transistor Q6. The resistance element R5 has an end connected to the emitter of the transistor Q6 and another end connected to ground.

With the configuration described above, the transistor Q6 outputs the control voltage Vctrl1 (first control voltage) from the collector thereof in accordance with changes in the power supply voltage Vcc. Specifically, when the power supply voltage Vcc is low, a little or no current flows through the collector and emitter of the transistor Q6. Thus, the voltage drop across the resistance element R4 is small, and the control voltage Vctrl1 is high. As the power supply voltage Vcc increases, the amount of current flowing through the collector and emitter of the transistor Q6 increases, and thus the control voltage Vctrl1 decreases due to the voltage drop across the resistance element R4.

Figure 3A:
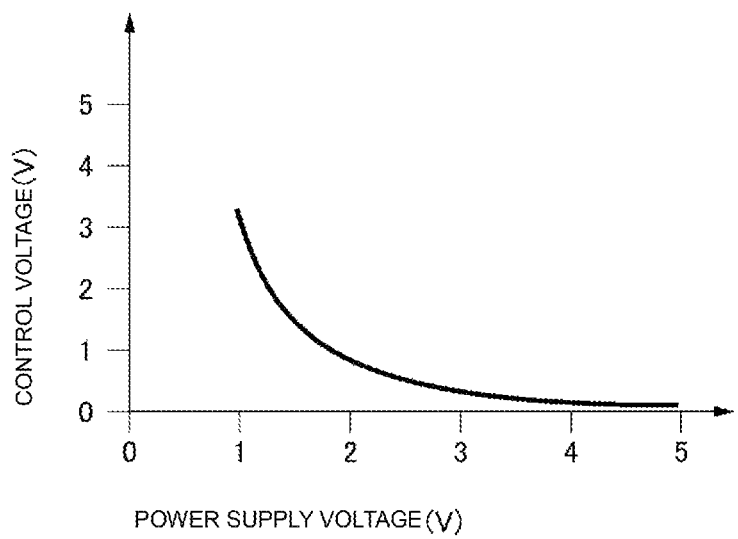
FIG. 3A illustrates a relationship between a power supply voltage and a control voltage.

FIG. 3A illustrates a relationship between the power supply voltage Vcc and the control voltage Vctrl1. In FIG. 3A, the horizontal axis represents the power supply voltage Vcc (V), and the vertical axis represents the control voltage Vctrl1 (V). As illustrated in FIG. 3A, the control voltage Vctrl1 has a characteristic of increasing with a decrease in the power supply voltage Vcc at least when the power supply voltage Vcc is less than a predetermined level (first level). The control voltage Vctrl1 changes markedly, in particular, in a region where the power supply voltage Vcc is comparatively low. In this way, the control circuit 150A has a function of inverting changes in the power supply voltage Vcc to produce a voltage and outputting the voltage.

Referring back to FIG. 2, the attenuation circuit 160A includes a transistor Q7a, a resistance element R6a, and a capacitor C3a.

The transistor Q7a (second transistor) has a collector connected to a supply path of the RF signal RF1 to the transistor Q1 via the capacitor C3a, a base connected to the collector of the transistor Q6 via the resistance element R6a, and an emitter coupled to ground. The term "being connected to a supply path", as used herein, is used to include not only being connected directly to the supply path but also being connected to the supply path via any other component such as an element. The operating state of the transistor Q7a is controlled by using the control voltage Vctrl1, which is supplied from the control circuit 150A. That is, the transistor Q7a is turned on when the control voltage Vctrl1 is high, and is turned off when the control voltage Vctrl1 is low. The transistor Q7a causes a portion of the RF signal RF1 to flow from the collector to the emitter when in the on state, thereby attenuating the RF signal RF1 traveling along the supply path to the transistor Q1.

The capacitor C3a is connected between the supply path of the RF signal RF1 and the collector of the transistor Q7a. The capacitor C3a prevents the DC component at the collector of the transistor Q7a from being supplied to the supply path of the RF signal RF1.

The attenuation circuit 160A may include a resistance element instead of the capacitor C3a or may include a resistance element connected in series with the capacitor C3a. When the attenuation circuit 160A includes such a resistance element as described above, the RF signal RF1 is attenuated by the sum of the resistance value between the collector and emitter of the transistor Q7a and the resistance value of the resistance element. That is, the resistance value of the resistance element is adjusted to adjust a relationship between the control voltage Vctrl1 and the amount of attenuation of the RF signal. As a result, the amount of attenuation of the RF signal can be controlled.

The resistance element R6a has an end connected to the collector of the transistor Q6 and another end connected to the base of the transistor Q7a. The resistance element R6a adjusts the voltage to be supplied to the base of the transistor Q7a from the control voltage Vctrl1.

Figure 3B:
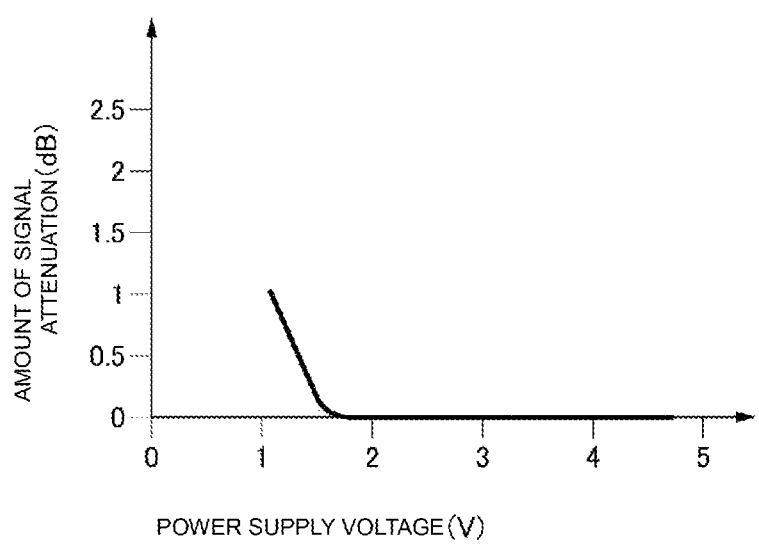
FIG. 3B illustrates a relationship between the power supply voltage and an amount of attenuation of an RF signal.

FIG. 3B illustrates a relationship between the power supply voltage Vcc and the amount of attenuation of an RF signal. In FIG. 3B, the horizontal axis represents the power supply voltage Vcc (V), and the vertical axis represents the amount of attenuation (dB) of the RF signal RF1. As described above, when the power supply voltage Vcc is less than a predetermined level (e.g., about 1.5 V), the control voltage Vctrl1 is higher than a voltage for turning on the transistor Q7a (e.g., about 1.7 V), and thus the RF signal RF1 is attenuated. The amount of attenuation of the RF signal RF1 increases as the power supply voltage Vcc decreases. When the power supply voltage Vcc is greater than or equal to the predetermined level, in contrast, the control voltage Vctrl1 is low, and thus the transistor Q7a is turned off. Accordingly, the RF signal RF1 is not substantially attenuated.

Figure 4A:
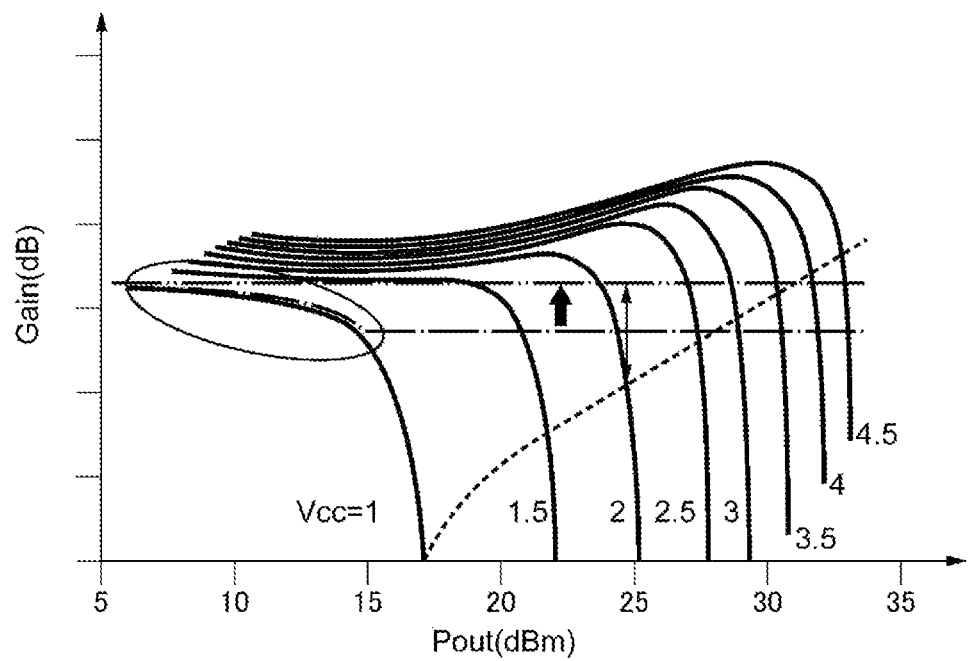
FIG. 4A illustrates relationships between the output power and gain of a transmission unit according to a comparative example.

Advantages of the transmission unit 100A will now be described with reference to FIGS. 4A and 4B. FIG. 4A illustrates relationships between the output power and gain of a transmission unit according to a comparative example, and FIG. 4B illustrates relationships between the output power and gain of the transmission unit 100A.

Figure 4B:
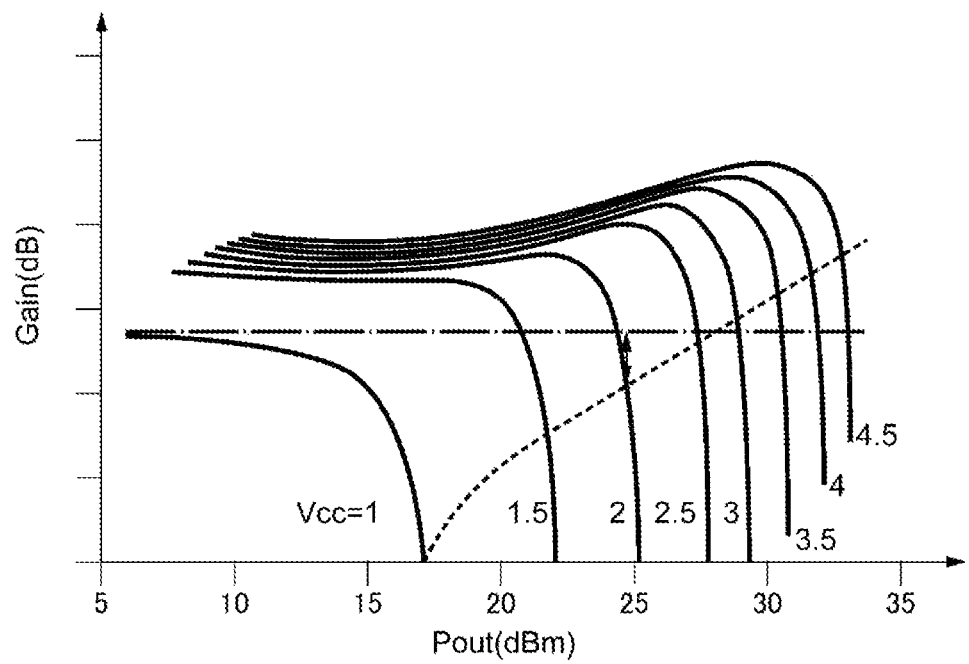
FIG. 4B illustrates relationships between the output power and gain of the transmission unit according to the first embodiment of the present disclosure.

In FIGS. 4A and 4B, the horizontal axis represents the output power (dBm) of the transmission unit, and the vertical axis represents the gain (dB). In FIGS. 4A and 4B, the solid lines indicate the respective gains when the power supply voltage Vcc is 1 V, 1.5 V, 2 V, 2.5 V, 3 V, 3.5 V, 4 V, and 4.5 V, the broken line indicates the trajectory of the maximum power added efficiencies (PAEs) at the respective power supply voltages (hereinafter also referred to as the "maximum PAE trajectory"), and the one-dot chain line indicates the gain operating line. Unlike the transmission unit 100A, the transmission unit according to the comparative example illustrated in FIG. 4A does not include the control circuit 150A or the attenuation circuit 160A.

As illustrated in FIG. 4A, as the power supply voltage Vcc increases, the gain increases and the output power at which the gain starts to decrease is increasing. Thus, adjusting the relationship between the envelope value of the RF signal and the power supply voltage Vcc and changing the power supply voltage Vcc along the gain operating line (one-dot chain line) illustrated in FIG. 4A can keep the gain substantially constant regardless of the output power.

However, the power supply voltage Vcc has a lower limit (e.g., about 1 V) required for the power supply circuit 140 to operate correctly. Thus, for example, as illustrated in FIG. 4A, it is difficult to reduce the power supply voltage Vcc to a level below about 1 V, and the gain is higher in a low output power region having an output power less than or equal to about 15 dBm than in any other region (as indicated in the circled portion in FIG. 4A). Thus, linearity in gain may deteriorate, causing a problem such as a poor adjacent channel leakage ratio (ACLR) characteristic.

To address the deterioration of linearity, for example, one conceivable method is to increase the target gain operating line in a direction indicated by the arrow illustrated in FIG. 4A (see the two-dot chain line in FIG. 4). To increase PAE, the gain operating line and the maximum PAE trajectory are brought into proximity to each other. In particular, a region having an output power greater than or equal to about 25 dBm is frequently used and dominant over the entire PAE, and it is therefore desirable that the gain operating line and the maximum PAE trajectory be as close to each other as possible. However, as illustrated in FIG. 4A, if the target gain operating line is increased, the gain operating line is more away from the maximum PAE trajectory, causing a decrease in PAE although the linearity in gain is enhanced.

In the transmission unit 100A, in contrast, the amount of attenuation of an RF signal is controlled to increase when the power supply voltage Vcc is low, and is controlled to decrease when the power supply voltage Vcc is high. With this control, as illustrated in FIG. 4B, when the power supply voltage Vcc is 1 V, the gain is prevented from increasing so as to follow the gain operating line (one-dot chain line). As a whole, the linearity in gain can be enhanced. In addition, the PAE can be prevented from deteriorating, compared to the case where the target gain operating line is increased.

In the transmission unit 100A, accordingly, the RF signal is attenuated when the power supply voltage Vcc is low, in accordance with changes in the power supply voltage Vcc based on the ET mode. Thus, the transmission unit 100A can enhance the linearity in gain and improve ACLR characteristics, compared to the configuration disclosed in International Publication 2013/133170.

In the configuration illustrated in FIG. 2, the attenuation circuit 160A is disposed only at the input of the amplifier in the initial stage. Alternatively, the attenuation circuit 160A may be disposed at the input of the amplifier in the subsequent stage instead of in the initial stage, or may be disposed at the input of both amplifiers.

A transmission unit may include three or more stages of amplifiers. For example, when three stages of amplifiers are included, the attenuation circuit 160A may be disposed at the input of the amplifiers in the first and second stages, or may be disposed at the input of all the amplifiers in the first to third stages.

In the example illustrate in FIG. 2, furthermore, the power supply voltage Vcc based on the ET mode is supplied to both the amplifiers in the initial and subsequent stages. However, the power supply voltage Vcc may be supplied to only either amplifier (e.g., the amplifier in the subsequent stage). In this case, a power supply voltage based on the APT mode may be supplied to the other amplifier.

Figure 5:
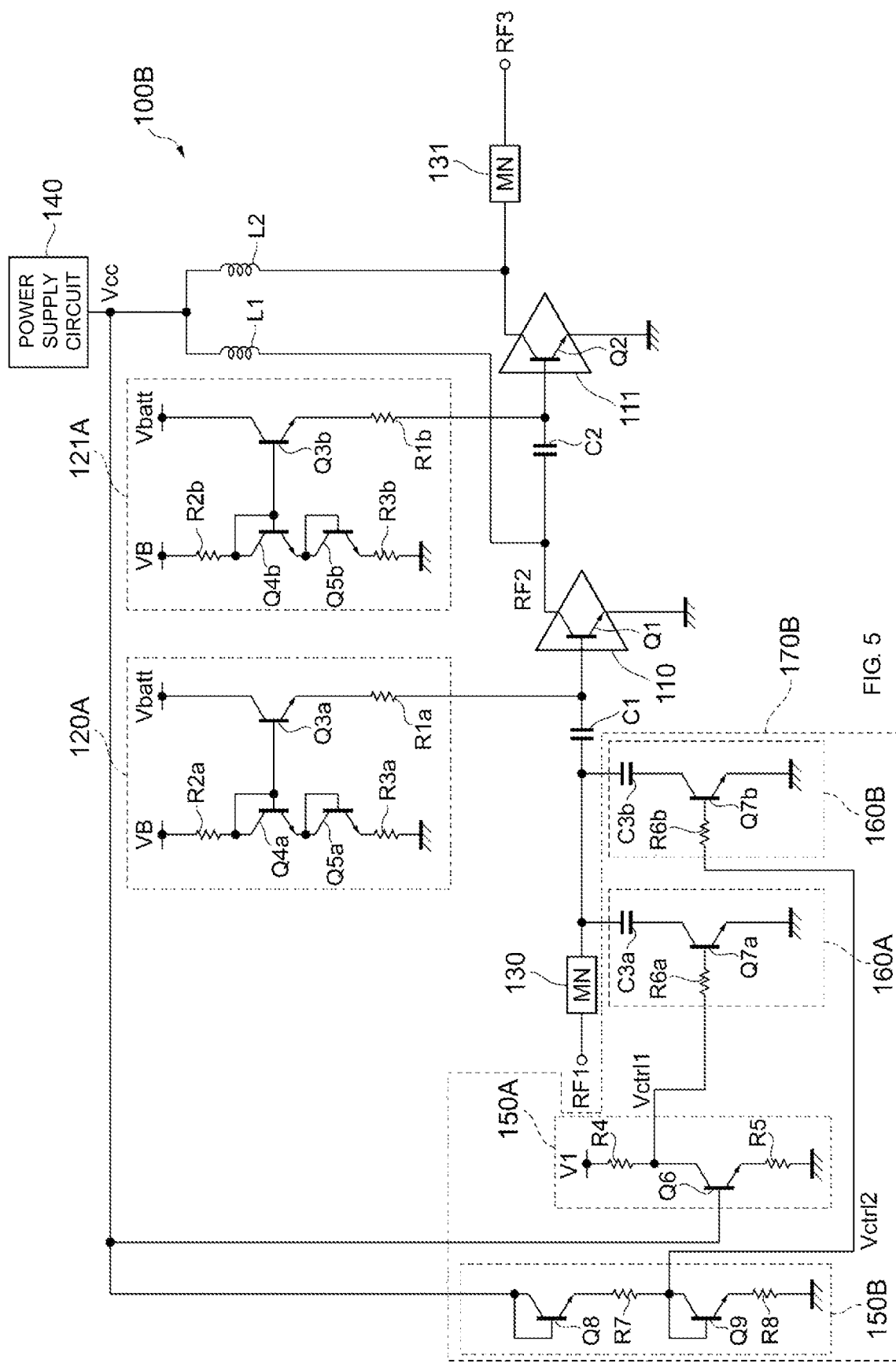
FIG. 5 illustrates an example configuration of a transmission unit according to a second embodiment of the present disclosure.

FIG. 5 illustrates an example configuration of a transmission unit according to a second embodiment of the present disclosure. In the second and subsequent embodiments, features common to the first embodiment will not be described again and only the differences are described. In particular, similar effects achieved by similar configurations will not be repeatedly described in the individual embodiments.

Unlike the transmission unit 100A illustrated in FIG. 2, a transmission unit 100B illustrated in FIG. 5 includes an attenuator 170B instead of the attenuator 170A. The attenuator 170B further includes a control circuit 150B and an attenuation circuit 160B in addition to the control circuit 150A and the attenuation circuit 160A.

The control circuit 150B (second control circuit) includes transistors Q8 and Q9 and resistance elements R7 and R8.

The transistor Q8 is diode-connected (second diode), with the collector supplied with the power supply voltage Vcc and the emitter connected to the collector of the transistor Q9 via the resistance element R7. The transistor Q9 is diode-connected, with the emitter connected to ground via the resistance element R8. The resistance element R7 (second load) has an end connected to the emitter of the transistor Q8 and another end connected to the collector of the transistor Q9. The resistance element R8 (third load) has an end connected to the emitter of the transistor Q9 and another end connected to ground.

Accordingly, the transistor Q9 outputs a control voltage Vctrl2 (second control voltage) from the collector thereof in accordance with changes in the power supply voltage Vcc. Specifically, the collector voltage of the transistor Q9 is equal to a value obtained by dividing the collector voltage of the transistor Q8 by the resistance value of the transistor Q8 and the resistance element R7 and the resistance value of the transistor Q9 and the resistance element R8. Thus, as the power supply voltage Vcc increases, the control voltage Vctrl2 also increases; as the power supply voltage Vcc decreases, the control voltage Vctrl2 also decreases.

Figure 6A:
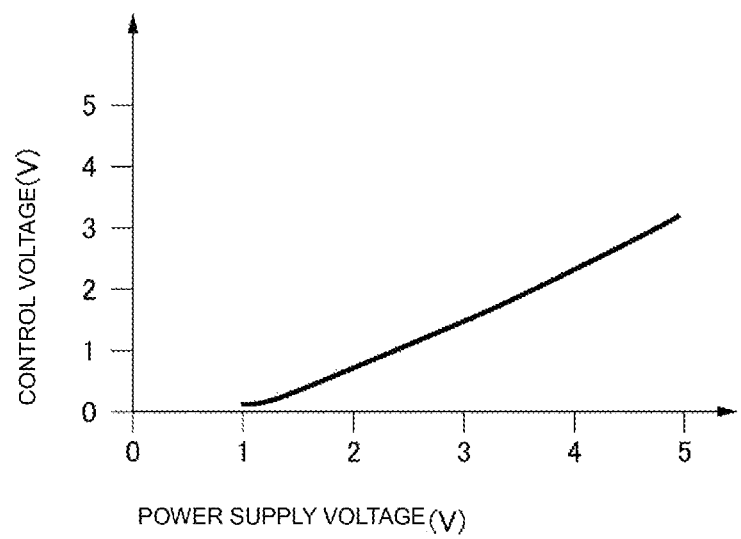
FIG. 6A illustrates a relationship between the power supply voltage and a control voltage.

FIG. 6A illustrates a relationship between the power supply voltage Vcc and the control voltage Vctrl2. In FIG. 6A, the horizontal axis represents the power supply voltage Vcc (V), and the vertical axis represents the control voltage Vctrl2 (V). As illustrated in FIG. 6A, the control voltage Vctrl2 has a characteristic of increasing with an increase in the power supply voltage Vcc. That is, the control circuit 150B has a function of converting the level of the power supply voltage Vcc in accordance with changes in the power supply voltage Vcc to produce a voltage and outputting the voltage.

Referring back to FIG. 5, the attenuation circuit 160B includes a transistor Q7b (fourth transistor), a resistance element R6*b*, and a capacitor C3*b*. The configuration of the attenuation circuit 160B is similar to the configuration of the attenuation circuit 160A and will not be described in detail, with the corresponding elements assigned similar numerals or symbols.

Figure 6B:
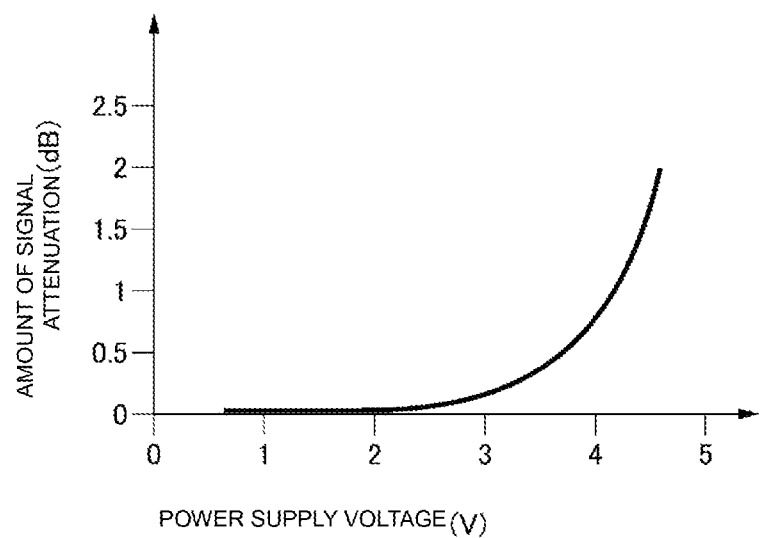
FIG. 6B illustrates a relationship between the power supply voltage and an amount of attenuation of an RF signal.
Figure 6C:
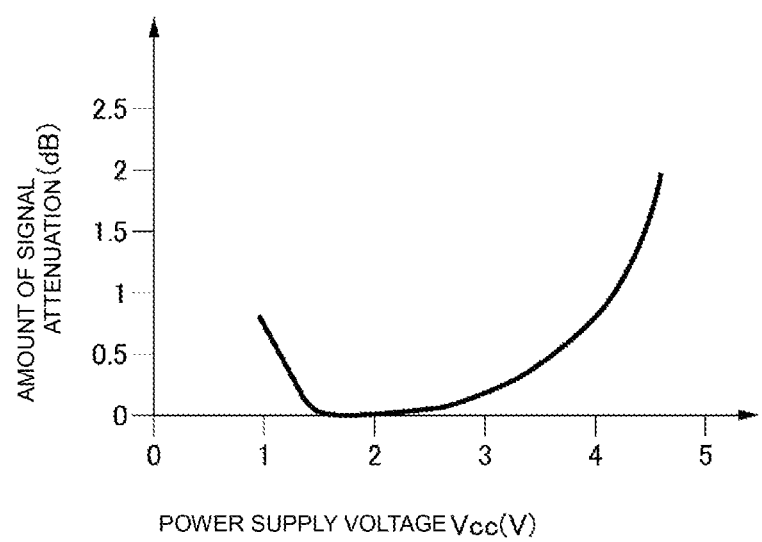
FIG. 6C illustrates a relationship between the power supply voltage Vcc and the amount of attenuation of the RF signal.

FIGS. 6B and 6C illustrate relationships between the power supply voltage Vcc and the amount of attenuation of an RF signal. In FIGS. 6B and 6C, the horizontal axis represents the power supply voltage Vcc (V), and the vertical axis represents the amount of attenuation (dB) of the RF signal RF1. In FIG. 6B, only the amount of attenuation at the attenuation circuit 160B is illustrated, and the amount of attenuation at the attenuation circuit 160A is not illustrated. In FIG. 6C, the sum of the amounts of attenuation at the attenuation circuits 160A and 160B is illustrated.

As illustrated in FIG. 6B, when the power supply voltage Vcc is low, the control voltage Vctrl2 is also low, and thus the transistor Q7*b* remains in the off state. As the power supply voltage Vcc increases, the control voltage Vctrl2 gradually increases. When the power supply voltage Vcc becomes greater than or equal to a predetermined level (e.g., about 2.5 V), the transistor Q7*b* is turned on. Accordingly, the amount of attenuation of the RF signal RF1 increases with an increase in the power supply voltage Vcc.

Adding together the amount of attenuation at the attenuation circuit 160A (see FIG. 3B) and the amount of attenuation at the attenuation circuit 160B (see FIG. 6B) yields a characteristic illustrated in FIG. 6C. That is, in a region where the power supply voltage Vcc is less than about 1.5 V (first level), the amount of attenuation of the RF signal increases with a decrease in the power supply voltage Vcc. In a region where the power supply voltage Vcc is greater than or equal to about 2.5 V (a second level higher than the first level), in contrast, the amount of attenuation of the RF signal increases with an increase in the power supply voltage Vcc.

Figure 7:
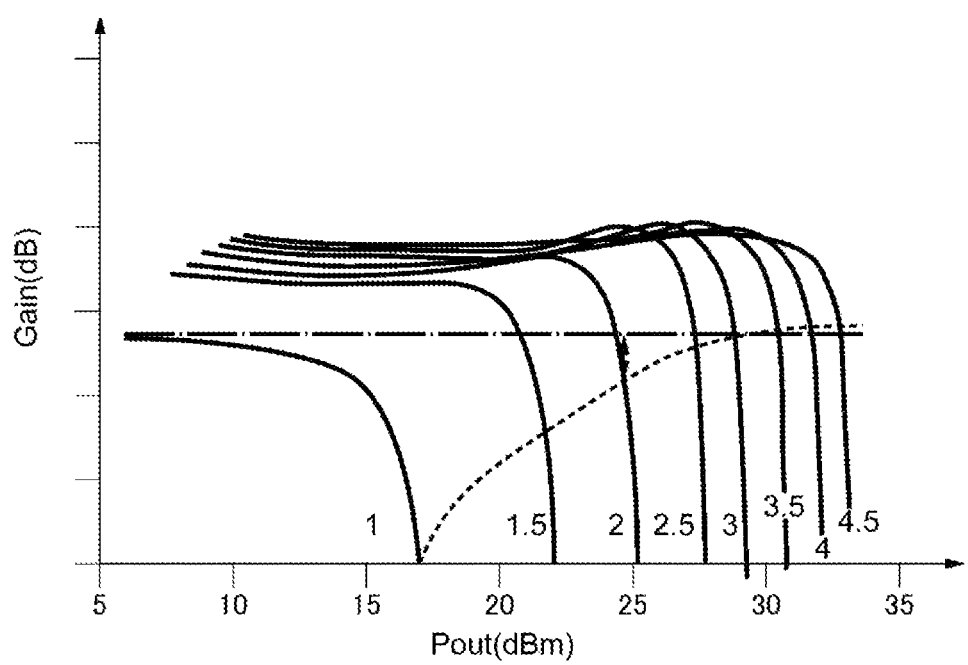
FIG. 7 illustrates relationships between the output power and gain of the transmission unit according to the second embodiment of the present disclosure.

Advantages of the transmission unit 100B will now be described with reference to FIG. 7. FIG. 7 illustrates relationships between the output power and gain of the transmission unit 100B. In FIG. 7, the horizontal axis represents the output power (dBm) of the transmission unit 100B, and the vertical axis represents the gain (dB) of the transmission unit 100B. In FIG. 7, as in FIG. 4B, the solid lines indicate the respective gains when the power supply voltage Vcc is 1 V, 1.5 V, 2 V, 2.5 V, 3 V, 3.5 V, 4 V, and 4.5 V, the broken line indicates the maximum PAE trajectory at the respective power supply voltages, and the one-dot chain line indicates the gain operating line.

As illustrated in FIG. 7, in a region where the power supply voltage Vcc is low, as in the transmission unit 100A described above, the attenuation circuit 160A prevents the gain from increasing. In the transmission unit 100B, the RF signal is also attenuated in a region where the power supply voltage Vcc is high. This prevents the gain from increasing, compared to the results of the transmission unit 100A illustrated in FIG. 4B, when the power supply voltage Vcc is, for example, 2.5 V, 3 V, 3.5 V, 4 V, and 4.5 V. Thus, the maximum PAE trajectory increases less steeply than that illustrated in FIG. 4B. In FIG. 7, the maximum PAE trajectory and the gain operating line are closer to each other, in particular, in a region having an output power greater than or equal to about 25 dBm. This may indicate that the transmission unit 100B has an advantage of enhancing the linearity in gain while preventing a decrease in PAE.

As described above, the transmission unit 100B attenuates an RF signal when the power supply voltage Vcc is low and also when the power supply voltage Vcc is high. Thus, the transmission unit 100B can improve PAE compared to the transmission unit 100A.

The control circuit 150B illustrated in FIG. 5 may not necessarily include the transistor Q9, for example. When the transistor Q9 is not included, the control circuit 150B operates at higher speeds than that when the transistor Q9 is included. Thus, even when the power supply voltage Vcc is changed rapidly (i.e., even when the envelope frequency of the RF signal is high), the control voltage Vctrl2 can be changed without delay or with less delay in response to a change in the power supply voltage Vcc.

Furthermore, the transmission unit 100B may not necessarily include the control circuit 150A or the attenuation circuit 160A.

Figure 8:
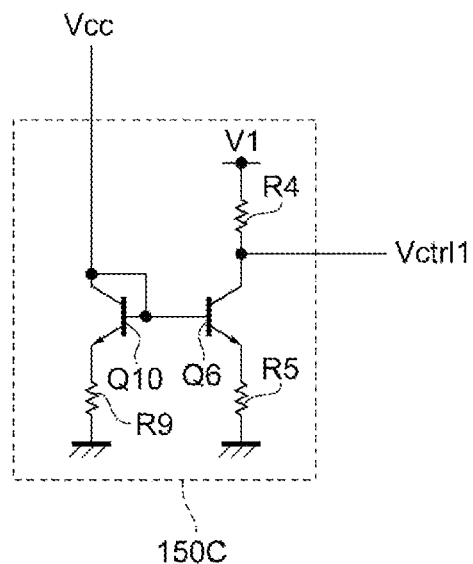
FIG. 8 illustrates a modification of a control circuit according to the first or second embodiment of the present disclosure.

FIG. 8 illustrates a modification of the control circuit 150. A control circuit 150C (first control circuit) illustrated in FIG. 8 has a function similar to that of the control circuit 150A illustrated in FIG. 2. In addition to the components of the control circuit 150A, the control circuit 150C further includes a transistor Q10 and a resistance element R9.

The transistor Q10 is diode-connected (first diode), with the collector supplied with the power supply voltage Vcc and the emitter connected to ground via the resistance element R9. The base of the transistor Q10 is connected to the base of the transistor Q6. That is, the transistor Q10 is connected to the transistor Q6 to form a current mirror. The resistance element R9 has an end connected to the emitter of the transistor Q10 and another end connected to ground.

The transistor Q10 and the resistance element R9 constitute a constant current circuit with the power supply circuit 140 being used as a power supply. That is, a constant current flows from the collector to the emitter of the transistor Q10 regardless of changes in the power supply voltage Vcc. This eliminates or reduces fluctuations in the characteristics of the control circuit 150C due to, for example, temperature changes or manufacturing variations, compared to the control circuit 150A. In addition, the control circuit 150C operates at higher speeds than the control circuit 150A in which the power supply voltage Vcc is supplied directly to the base of the transistor Q6. Thus, the control voltage Vctrl1 can be changed without delay or with less delay in response to a change in the power supply voltage Vcc.

Figure 9:
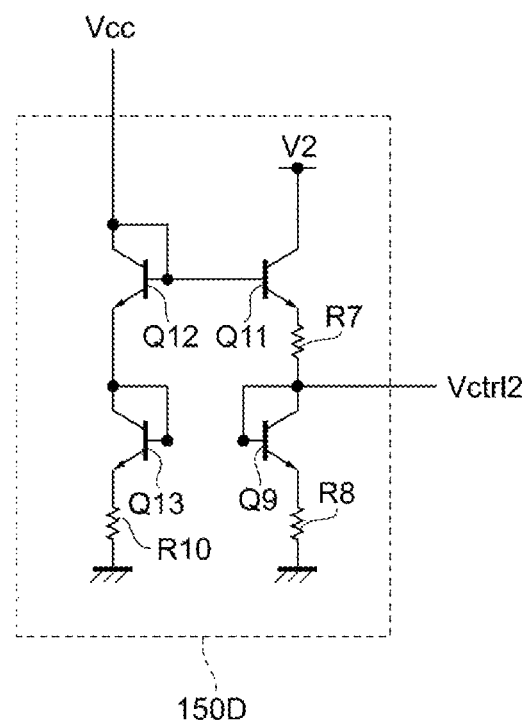
FIG. 9 illustrates another modification of the control circuit according to the first or second embodiment of the present disclosure.

FIG. 9 illustrates another modification of the control circuit 150. A control circuit 150D (second control circuit) illustrated in FIG. 9 has a function similar to the control circuit 150B illustrated in FIG. 5. Unlike the control circuit 150B, the control circuit 150D includes a transistor Q11 instead of the transistor Q8 and further includes transistors Q12 and Q13 and a resistance element R10.

The transistor Q11 (fifth transistor) has a collector supplied with a predetermined voltage V2, a base connected to the base of the transistor Q12, and an emitter connected to the collector of the transistor Q9 via the resistance element R7.

The transistor Q12 is diode-connected (second diode), with the collector supplied with the power supply voltage Vcc and the emitter connected to the collector of the transistor Q13. The transistor Q12 is connected to the transistor Q11 to form a current mirror. The transistor Q13 is diode-connected, with the emitter connected to ground via the resistance element R10. The resistance element R10 has an end connected to the emitter of the transistor Q13 and another end connected to ground.

The transistors Q12 and Q13 and the resistance element R10 constitute a constant current circuit with the power supply circuit 140 being used as a power supply. That is, a constant current flows from the collectors to the emitters of the transistors Q12 and Q13 regardless of changes in the power supply voltage Vcc. This eliminates or reduces fluctuations in the characteristics of the control circuit 150D due to, for example, temperature changes or manufacturing variations, compared to the control circuit 150B. In addition, the control circuit 150D operates at higher speeds than the control circuit 150B in which the power supply voltage Vcc is supplied directly to the collector of the transistor Q8. Thus, the control voltage Vctrl2 can be changed without delay or with less delay in response to a change in the power supply voltage Vcc.

The control circuit 150D illustrated in FIG. 9 may not necessarily include the transistor Q13, for example, or may not necessarily include the transistor Q9. When the transistor Q13 or Q9 is not included, the control circuit 150D operates at higher speeds than that when the transistors Q13 and Q9 are included. Thus, the control voltage Vctrl2 can be changed without delay or with less delay in response to a change in the power supply voltage Vcc. Further, the control circuit 150D may not necessarily include the resistance element R10, for example.

Figure 10:
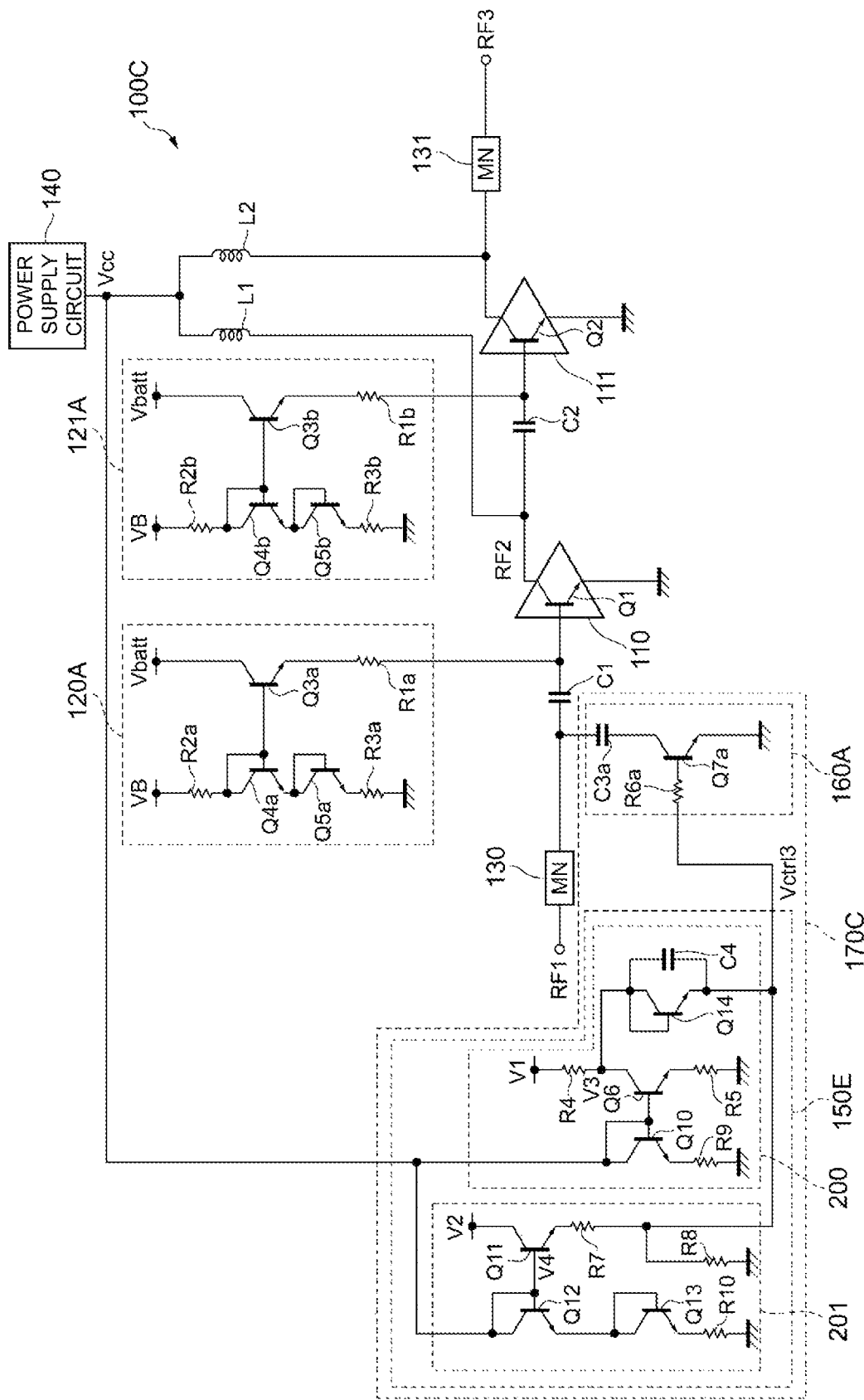
FIG. 10 illustrates an example configuration of a transmission unit according to a third embodiment of the present disclosure.

FIG. 10 illustrates an example configuration of a transmission unit according to a third embodiment of the present disclosure. A transmission unit 100C illustrated in FIG. 10 includes an attenuator 170C instead of the attenuator 170B, unlike the transmission unit 100B illustrated in FIG. 5. The attenuator 170C includes, instead of the control circuits 150A and 150B, a control circuit 150E having both the functions of the control circuits 150A and 150B.

The control circuit 150E (first control circuit) includes a first circuit unit 200, which is similar to the control circuit 150C illustrated in FIG. 8, and a second circuit unit 201, which is similar to the control circuit 150D illustrated in FIG. 9. The first circuit unit 200 and the second circuit unit 201 are connected in parallel to each other.

The first circuit unit 200 further includes a transistor Q14 and a capacitor C4 in addition to the configuration of the control circuit 150C. The transistor Q14 is diode-connected (fourth diode), with the collector connected to the collector of the transistor Q6 and the emitter connected to the base of the transistor Q7a via the resistance element R6a. The capacitor C4 is connected in parallel to the transistor Q14. The capacitor C4 is disposed to enhance the tracking performance of a control voltage Vctrl3 (first control voltage) even when the power supply voltage Vcc changes rapidly.

The second circuit unit 201 is the same as the control circuit 150D, except that the second circuit unit 201 does not include the transistor Q9, and will not be described in detail here.

With the configuration described above, the control circuit 150E outputs the control voltage Vctrl3 based on the emitter voltage (first voltage) of the transistor Q14 and the voltage (second voltage) at the node of the resistance element R7 and the resistance element R8. The control voltage Vctrl3 changes due to the effects described below to allow the attenuation circuit 160A to perform attenuation similar to that in accordance with the characteristic illustrated in FIG. 6C.

The collector voltage of the transistor Q6 is represented as a voltage V3, and the base voltage of the transistor Q11 is represented as a voltage V4. As described above, the collector voltage (the voltage V3) of the transistor Q6 is a voltage obtained by inverting changes in the power supply voltage Vcc, and the base voltage (the voltage V4) of the transistor Q11 is a voltage that changes in a way similar to the changes in the power supply voltage Vcc.

When the power supply voltage Vcc is less than, for example, about 1.5 V (first level), the transistor Q14 is turned on since the voltage V3 is high, and the transistor Q11 is turned off since the voltage V4 is low. Thus, the voltage V3 is dominant as the control voltage Vctrl3, resulting in decreasing the amount of attenuation with an increase in the power supply voltage Vcc. When the power supply voltage Vcc is greater than or equal to, for example, about 1.5 V (first level) and less than about 2.5 V (second level), the transistor Q14 is turned off since the voltage V3 is low, and the transistor Q11 is also turned off since the voltage V4 is also low. Thus, the RF signal is not substantially attenuated. When the power supply voltage Vcc is greater than or equal to, for example, about 2.5 V (second level), the transistor Q14 is turned off since the voltage V3 is low, and the transistor Q11 is turned on since the voltage V4 is high. Thus, the voltage V4 is dominant as the control voltage Vctrl3, resulting in increasing the amount of attenuation with an increase in the power supply voltage Vcc.

Accordingly, the transmission unit 100C can achieve advantages similar to those of the transmission unit 100B. In addition, since the control circuit 150E has the functions of the control circuit 150C and the control circuit 150D, the transmission unit 100C does not need to include both the attenuation circuits 160A and 160B, leading to a reduction in circuit size. Moreover, no extra loss is incurred, and the efficiency of a transmission unit can be improved.

Figure 11:
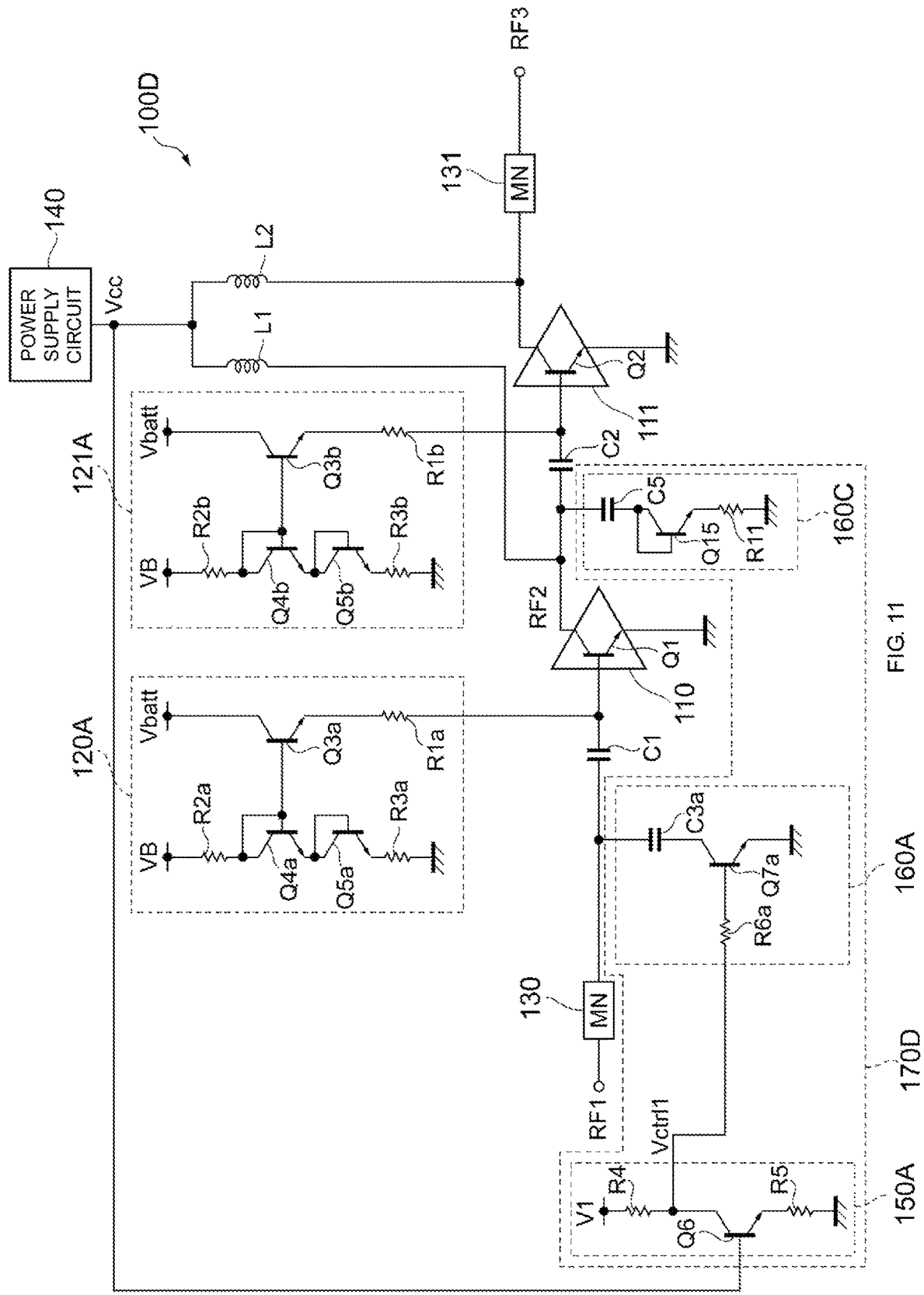
FIG. 11 illustrates an example configuration of a transmission unit according to a fourth embodiment of the present disclosure.

FIG. 11 illustrates an example configuration of a transmission unit according to a fourth embodiment of the present disclosure. A transmission unit 100D illustrated in FIG. 11 includes an attenuator 170D instead of the attenuator 170B, unlike the transmission unit 100B illustrated in FIG. 5. The attenuator 170D includes an attenuation circuit 160C instead of the control circuit 150B and the attenuation circuit 160B.

The attenuation circuit 160C is disposed on the input side of the amplifier 111 in the subsequent stage. Specifically, the attenuation circuit 160C includes a transistor Q15, a resistance element R11, and a capacitor C5.

The transistor Q15 is diode-connected (third diode). Instead of the base of the transistor Q15 being supplied with the control voltage Vctrl1, the base of the transistor Q15 is connected to the collector of the transistor Q15. The resistance element R11 has an end connected to the emitter of the transistor Q15 and another end connected to ground. The capacitor C5 has an end connected to a supply path of the RF signal RF2 to the transistor Q2 and another end connected to the collector of the transistor Q15.

In the attenuation circuit 160C, when the RF signal RF2 is supplied to the collector of the transistor Q15 via the capacitor C5, the collector voltage of the transistor Q15 vibrates and the voltage at the base connected to the collector of the transistor Q15 also vibrates. An increase in the power level of the RF signal RF2 causes the transistor Q15 to change from the off state to the on state. Accordingly, the transistor Q15 causes a portion of the RF signal RF2 to flow from the collector to the emitter, thereby attenuating the RF signal RF2. The higher the power level of the RF signal RF2 and the larger the voltage amplitude, the more likely it is to turn on the transistor Q15, resulting in increasing the amount of attenuation. Thus, as with the characteristic illustrated in FIG. 6B, the attenuation circuit 160C functions as an attenuation circuit at which the amount of attenuation of an RF signal increases with an increase in the power supply voltage Vcc.

Also, with the configuration described above, the transmission unit 100D can achieve advantages similar to those of the transmission unit 100B. In addition, the transmission unit 100D does not need to include the control circuit 150B, leading to a reduction in circuit size.

In the example illustrated in FIG. 11, the attenuation circuit 160C is disposed at the input of the amplifier in the subsequent stage. This is not intended to exclude a configuration in which the attenuation circuit 160C is disposed at the input of the amplifier in the initial stage. A configuration in which the attenuation circuit 160C is disposed at the input of the amplifier in the subsequent stage provides a larger voltage amplitude at the collector of the transistor Q15 than the configuration in which the attenuation circuit 160C is disposed at the input of the amplifier in the preceding stage, and makes the advantage of attenuating the RF signal more noticeable.

Exemplary embodiments of the present disclosure have been described. The transmission unit 100A includes the transistor Q1 that amplifies the power of the RF signal RF1 and outputs the RF signal RF2, the power supply circuit 140 that supplies the power supply voltage Vcc, which changes in accordance with the amplitude level of the RF signal RF1, to the transistor Q1, and an attenuator that attenuates the RF signal RF1 in such a manner that the amount of attenuation of the RF signal RF1 increases with a decrease in the power supply voltage Vcc when the power supply voltage Vcc is less than a first level. This configuration prevents the gain of the transmission unit 100A from increasing in a low output power region and improves linearity in gain compared to the configuration disclosed in International Publication 2013/133170.

In the transmission unit 100A, the attenuator includes the transistor Q7a that attenuates the RF signal RF1 in accordance with the control voltage Vctrl1, and the control circuit 150A that outputs the control voltage Vctrl1 based on the power supply voltage Vcc in such a manner that the amount of attenuation of the RF signal RF1 increases with a decrease in the power supply voltage Vcc when the power supply voltage Vcc is less than the first level. Further, the control voltage Vctrl1 increases with a decrease in the power supply voltage Vcc when the power supply voltage Vcc is less than the first level. The transistor Q7a has a collector connected to a supply path of the RF signal RF1 to the transistor Q1, an emitter coupled to ground, and a base supplied with the control voltage Vctrl1. The transistor Q7a allows a portion of the RF signal RF1 to flow from the collector to the emitter of the transistor Q7a in accordance with the control voltage Vctrl1. This configuration can attenuate the RF signal in a low output power region.

As a non-limiting example, the control circuit 150A may include the transistor Q6 having a collector supplied with the predetermined voltage V1 via the resistance element R4, a base supplied with the power supply voltage Vcc, and an emitter coupled to ground, and the control circuit 150A may output the collector voltage of the transistor Q6 as the control voltage Vctrl1. This configuration enables the control circuit 150A to output the control voltage Vctrl1, which is obtained by inverting changes in the power supply voltage Vcc.

The control circuit 150C further includes a diode (the transistor Q10) connected to the transistor Q6 to form a current mirror. This configuration allows a constant current to flow from the collector to the emitter of the transistor Q6 regardless of changes in the power supply voltage Vcc. This eliminates or reduces fluctuations in the characteristics of the control circuit 150C due to, for example, temperature changes or manufacturing variations, compared to the control circuit 150A. In addition, the control voltage Vctrl1 can be changed without delay or with less delay in response to a change in the power supply voltage Vcc.

In the transmission unit 100B, the attenuator further includes the transistor Q7b that attenuates the RF signal RF1 in accordance with the control voltage Vctrl2, and the control circuit 150B that outputs the control voltage Vctrl2 based on the power supply voltage Vcc in such a manner that the amount of attenuation of the RF signal RF1 increases with an increase in the power supply voltage Vcc when the power supply voltage Vcc is greater than or equal to a second level higher than the first level. This configuration attenuates the RF signal RF1 when the power supply voltage Vcc is low and also when the power supply voltage Vcc is high. This prevents the gain of the transmission unit 100B from increasing in a high output power and can thus improve PAE compared to the transmission unit 100A.

Further, the control voltage Vctrl2 increases with an increase in the power supply voltage Vcc when the power supply voltage Vcc is greater than or equal to the second level. The transistor Q7b has a collector connected to a supply path of the RF signal RF1 to the transistor Q1, an emitter coupled to ground, and a base supplied with the control voltage Vctrl2. The transistor Q7b allows a portion of the RF signal RF1 to flow from the collector to the emitter of the transistor Q7b in accordance with the control voltage Vctrl2. This configuration can attenuate the RF signal in a high output power region.

As a non-limiting example, the control circuit 150B may include a diode (the transistor Q8) having an anode supplied with the power supply voltage Vcc and a cathode coupled to ground, and the resistance elements R7 and R8 connected in series between the cathode of the diode and ground, and may output, as the control voltage Vctrl2, a voltage divided by the resistance elements R7 and R8. This configuration can output the control voltage Vctrl2, which increases with an increase in the power supply voltage Vcc.

Further, the control circuit 150D includes a diode (the transistor Q12) having an anode supplied with the power supply voltage Vcc and a cathode coupled to ground, the transistor Q11 connected to the diode to form a current mirror, and the resistance elements R7 and R8 connected in series between the emitter of the transistor Q11 and ground, and outputs, as the control voltage Vctrl2, a voltage divided by the resistance elements R7 and R8. This configuration allows a constant current to flow from the collector to the emitter of the transistor Q11 regardless of changes in the power supply voltage Vcc. This eliminates or reduces fluctuations in the characteristics of the control circuit 150D due to, for example, temperature changes or manufacturing variations, compared to the control circuit 150B. In addition, the control voltage Vctrl2 can be changed without delay or with less delay in response to a change in the power supply voltage Vcc.

The transmission unit 100D further includes the transistor Q2 that amplifies the power of the RF signal RF2 and outputs the RF signal RF3. The attenuator further includes a diode (the transistor Q15) having an anode connected to a supply path of the RF signal RF2 to the transistor Q2 and a cathode coupled to ground. With this configuration, in the transmission unit 100D, the higher the power level of the RF signal RF2, the more likely it is to turn on the transistor Q15, resulting in increasing the amount of attenuation. Thus, the transmission unit 100D can achieve advantages similar to those of the transmission unit 100B. In addition, the transmission unit 100D does not need to include the control circuit 150B, leading to a reduction in circuit size.

In the transmission unit 100C, the control voltage Vctrl3 increases with an increase in the power supply voltage Vcc when the power supply voltage Vcc is greater than or equal to a second level higher than the first level. This configuration allows the transmission unit 100C to achieve advantages similar to those of the transmission unit 100B. In addition, the transmission unit 100C does not need to include the attenuation circuit 160B, leading to a reduction in circuit size. In addition, no extra loss is incurred, and the efficiency of a transmission unit can be improved. As a non-limiting example, the control circuit 150E may include the first circuit unit 200 and the second circuit unit 201, which are connected in parallel to each other. The first circuit unit 200 may output a first voltage that increases with a decrease in the power supply voltage Vcc when the power supply voltage Vcc is less than the first level, and the second circuit unit 201 may output a second voltage that increases with an increase in the power supply voltage Vcc when the power supply voltage Vcc is greater than or equal to the second level. The control circuit 150E may output the control voltage Vctrl3 based on the first voltage and the second voltage.

In the transmission unit 100C, the first circuit unit 200 includes the transistor Q6 having a collector supplied with the predetermined voltage V1 via the resistance element R4, a base supplied with the power supply voltage Vcc, and an emitter coupled to ground, and a diode (the transistor Q14) connected between the collector of the transistor Q6 and the base of the transistor Q7a. The second circuit unit 201 includes the transistor Q11 having a collector supplied with the predetermined voltage V2, a base supplied with the power supply voltage Vcc, and an emitter coupled to ground, and the resistance elements R7 and R8, which are connected in series between the emitter of the transistor Q11 and ground. The first voltage is the cathode voltage of the diode (the transistor Q14), and the second voltage is a voltage divided by the resistance elements R7 and R8. This configuration can generate the control voltage Vctrl3, which decreases with an increase in the power supply voltage Vcc when the power supply voltage Vcc is less than the first level and which increases with an increase in the power supply voltage Vcc when the power supply voltage Vcc is greater than or equal to a second level higher than the first level.

The embodiments described above are intended to help easily understand the present disclosure and are not to be used to construe the present disclosure in a limiting fashion. The present disclosure may be modified or improved without departing from the gist thereof, and equivalents of such modifications or improvements are also included in the present disclosure. That is, the embodiments may be appropriately modified in design by those skilled in the art, and such modifications also fall within the scope of the present disclosure so long as the modifications include the features of the present disclosure. For example, elements included in the embodiments and the arrangements, materials, conditions, shapes, sizes, and so on thereof are not limited to those illustrated exemplarily but can be modified as appropriate. Elements included in the embodiments can be combined as much as technically possible, and such combinations of elements also fall within the scope of the present disclosure so long as the combinations of elements include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A transmission unit comprising:
   a first transistor configured to amplify a power of a first signal and to output a second signal;
   a power supply circuit configured to supply a power supply voltage to the first transistor, the power supply voltage changing in accordance with an amplitude level of the first signal; and
   an attenuation circuit, to which the power supply voltage is inputted, configured to attenuate the first signal such that, when the power supply voltage is less than a first level, the attenuation circuit is configured to cause a level of attenuation of the first signal to increase with a decrease in the power supply voltage.

2. The transmission unit according to claim 1, wherein the attenuation circuit comprises:
   a second transistor configured to attenuate the first signal in accordance with a first control voltage, and
   a first control circuit, to which the power supply voltage is inputted, configured to output the first control voltage based on the power supply voltage.

3. The transmission unit according to claim 2, wherein:
   the first control circuit is configured to increase the first control voltage with the decrease in the power supply voltage when the power supply voltage is less than the first level,
   the second transistor has a collector connected between an input of the first signal and the first transistor, an emitter coupled to the ground, and a base supplied with the first control voltage, and
   the second transistor is configured to allow a portion of the first signal to flow from the collector to the emitter of the second transistor in accordance with the first control voltage.

4. The transmission unit according to claim 3, wherein the first control circuit comprises:
   a third transistor having a collector supplied with a predetermined voltage via a first load, a base supplied with the power supply voltage, and an emitter coupled to the ground, and
   wherein the first control circuit is configured to output a collector voltage of the third transistor as the first control voltage.

5. The transmission unit according to claim 4, wherein the first control circuit further comprises:
   a first diode connected to the third transistor to form a current mirror.

6. The transmission unit according to claim 2, wherein the attenuation circuit further comprises:
   a fourth transistor configured to attenuate the first signal in accordance with a second control voltage, and
   a second control circuit configured to output the second control voltage based on the power supply voltage such that, when the power supply voltage is greater than or equal to a second level, the attenuation circuit is configured to cause a level of attenuation of the first signal to increase with an increase in the power supply voltage,
   wherein the second level is greater than the first level.

7. The transmission unit according to claim 6, wherein:
   the second control circuit is configured to increase the second control voltage with the increase in the power supply voltage,
   the fourth transistor has a collector connected between an input of the first signal and the first transistor, an emitter coupled to the ground, and a base supplied with the second control voltage, and the fourth transistor is configured to allow a portion of the first signal to flow from the collector to the emitter of the fourth transistor in accordance with the second control voltage.

8. The transmission unit according to claim 7, wherein the second control circuit comprises:
a second diode having an anode supplied with the power supply voltage and a cathode coupled to the ground;
a second load; and
a third load, the second load and the third load being connected in series between the cathode of the second diode and the ground, and
wherein the second control circuit is configured to output, as the second control voltage, a voltage divided by the second load and the third load.

9. The transmission unit according to claim 7, wherein the second control circuit comprises:
a second diode having an anode supplied with the power supply voltage and a cathode coupled to the ground;
a fifth transistor connected to the second diode to form a current mirror;
a second load; and
a third load, the second load and the third load being connected in series between an emitter of the fifth transistor and the ground, and
wherein the second control circuit is configured to output, as the second control voltage, a voltage divided by the second load and the third load.

10. The transmission unit according to claim 1, further comprising:
a sixth transistor configured to amplify a power of the second signal and to output a third signal,
wherein the attenuation circuit comprises a third diode having an anode connected between an output of the first transistor and an input of the sixth transistor, and a cathode coupled to the ground.

11. The transmission unit according to claim 3, wherein the first control voltage is configured to increase with an increase in the power supply voltage when the power supply voltage is greater than or equal to a second level, and wherein the second level is greater than the first level.

12. The transmission unit according to claim 11, wherein:
the first control circuit further comprises a first circuit and a second circuit, the first circuit and the second circuit being connected in parallel,
the first circuit is configured to output a first voltage that increases with the decrease in the power supply voltage when the power supply voltage is less than the first level,
the second circuit is configured to output a second voltage that increases with the increase in the power supply voltage when the power supply voltage is greater than or equal to the second level, and the first control circuit is configured to output the first control voltage based on the first voltage and the second voltage.

13. The transmission unit according to claim 12, wherein the first circuit comprises:
a third transistor having a collector supplied with a first predetermined voltage via a first load, a base supplied with the power supply voltage, and an emitter coupled to the ground; and
a fourth diode connected between the collector of the third transistor and a base of the second transistor,
wherein the second circuit comprises:
a fifth transistor having a collector supplied with a second predetermined voltage, a base supplied with the power supply voltage, and an emitter coupled to the ground;
a second load; and
a third load; the second load and the third load being connected in series between the emitter of the fifth transistor and the ground, and
wherein the first voltage is a cathode voltage of the fourth diode, and the second voltage is a voltage divided by the second load and the third load.

14. The transmission unit according to claim 2, further comprising:
a sixth transistor configured to amplify a power of the second signal and to output a third signal,
wherein the attenuation circuit comprises a third diode having an anode connected between an output of the first transistor and an input of the sixth transistor, and a cathode coupled to the ground.

15. The transmission unit according to claim 3, further comprising:
a sixth transistor configured to amplify a power of the second signal and to output a third signal,
wherein the attenuation circuit comprises a third diode having an anode connected between an output of the first transistor and an input of the sixth transistor, and a cathode coupled to the ground.

16. The transmission unit according to claim 4, further comprising:
a sixth transistor configured to amplify a power of the second signal and to output a third signal,
wherein the attenuation circuit comprises a third diode having an anode connected between an output of the first transistor and an input of the sixth transistor, and a cathode coupled to the ground.

17. The transmission unit according to claim 5, further comprising:
a sixth transistor configured to amplify a power of the second signal and to output a third signal,
wherein the attenuation circuit comprises a third diode having an anode connected between an output of the first transistor and an input of the sixth transistor, and a cathode coupled to the ground.

* * * * *